US008932937B2

(12) United States Patent
Lee et al.

(10) Patent No.: US 8,932,937 B2
(45) Date of Patent: Jan. 13, 2015

(54) PHOTORESIST MASK-FREE OXIDE DEFINE REGION (ODR)

(75) Inventors: Chu-Sheng Lee, Tainan (TW); Hsin-Chi Chen, Tainan (TW); Chu-Wei Hu, Shin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/151,442

(22) Filed: May 20, 2002

(65) Prior Publication Data

US 2003/0214013 A1 Nov. 20, 2003

(51) Int. Cl.
*H01L 21/76* (2006.01)

(52) U.S. Cl.
USPC .......................................................... 438/427

(58) Field of Classification Search
USPC .................................................. 438/424, 427
See application file for complete search history.

(56) References Cited

U.S. PATENT DOCUMENTS

| | | | | |
|---|---|---|---|---|
| 5,923,993 A | * | 7/1999 | Sahota | |
| 6,048,775 A | * | 4/2000 | Yao et al. | |
| 6,071,792 A | * | 6/2000 | Kim et al. | |
| 6,159,822 A | * | 12/2000 | Yang et al. | |
| 6,171,929 B1 | * | 1/2001 | Yang et al. | |
| 6,191,000 B1 | * | 2/2001 | Huang et al. | |
| 6,207,533 B1 | * | 3/2001 | Gao | |
| 6,528,389 B1 | * | 3/2003 | Allman et al. | |

OTHER PUBLICATIONS

Peter Van Zant, "Microchip Fabrication: A Practical Guide to Semiconductor Processing," fourth edition, Copyright 2000, McGraw-Hill publisher, pp. 605 and 607.

* cited by examiner

*Primary Examiner* — Carl Whitehead, Jr.
*Assistant Examiner* — David S Blum
(74) *Attorney, Agent, or Firm* — Tung & Associates

(57) ABSTRACT

Defining an oxide define region (ODR) without using a photomask is disclosed. Pad oxide and a stop layer are deposited over peaks of a substrate of a semiconductor wafer. The pad oxide may be silicon oxide, whereas the stop layer may be silicon nitride. Oxide, such as high-density plasma (HDP) oxide, is deposited over the pad oxide, the stop layer, and valleys of the substrate of the semiconductor wafer. A hard mask, such as silicon nitride, is deposited over the oxide, and photoresist is deposited over the hard mask. The photoresist is etched back until peaks of the hard mask are exposed. The peaks of the hard mask and the oxide underneath are etched through to the stop layer, and the photoresist is removed. Chemical-mechanical planarization (CMP) can then be performed on the hard mask that remains and the oxide underneath through to the stop layer, and the stop layer removed.

11 Claims, 7 Drawing Sheets

FIG 1A

PRIOR ART

FIG 1B

PRIOR ART

FIG 1C

PRIOR ART

FIG 1D

PRIOR ART

FIG 1E

PRIOR ART

FIG 1F

PRIOR ART

FIG 1G

PRIOR ART

PHOTORESIST MASK-FREE OXIDE DEFINE REGION (ODR)

FIELD OF THE INVENTION

This invention relates generally to semiconductor device fabrication, and more particularly to oxide define regions (ODR's) that may be utilized in such fabrication.

BACKGROUND OF THE INVENTION

Oxide define regions (ODR's) are used in the fabrication of some types of semiconductor devices, such as static random-access memories (SRAM's). Typically, holes are etched in accordance with the desired ODR, so that impurities may be injected, and so on. The ODR's are typically defined by a mask transferred to semiconductor wafers using photoresist. The photoresist protects the oxide from being etched. Where no photoresist is present, the ODR's are defined.

Figure 1A:
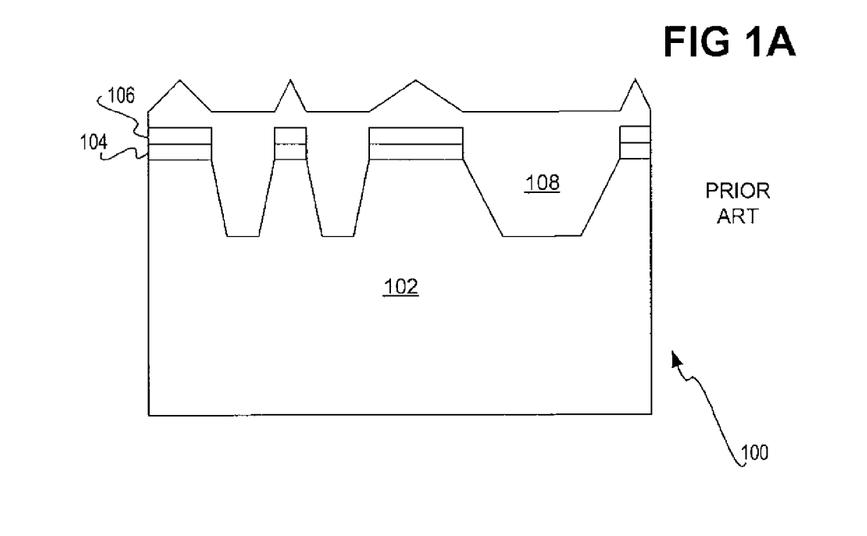
FIGS. 1A-1G are diagrams illustratively showing a conventional process that includes defining an oxide define region (ODR) using a photomask.
Figure 1B:
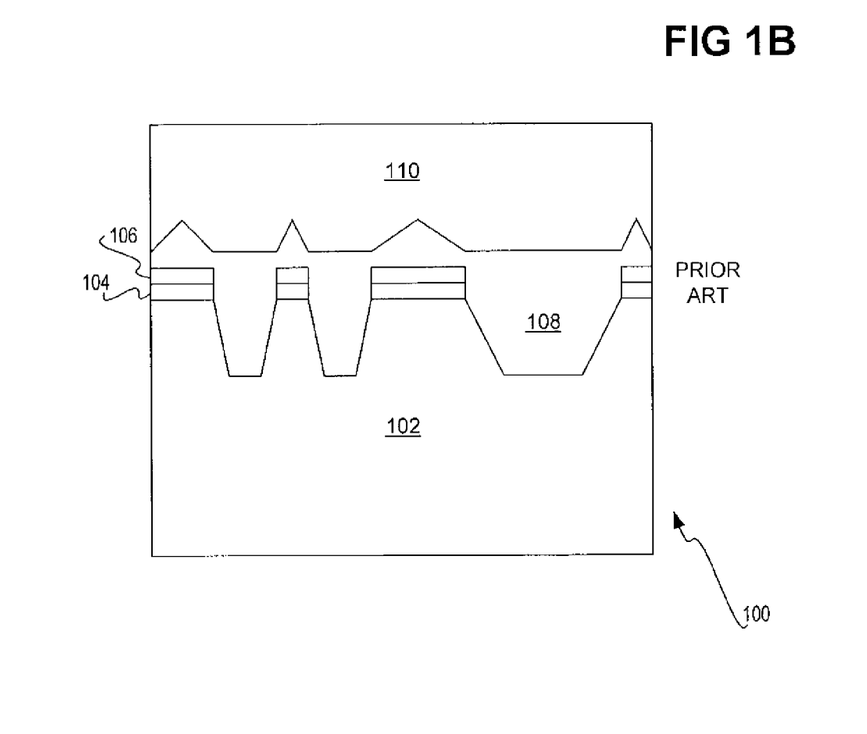

FIGS. 1A-1G illustratively show the typical process for defining ODR's. In FIG. 1A, the semiconductor device 100 being fabricated includes a substrate 102, such as a p substrate. Pad oxide 104 has been grown on the peaks of the substrate 102. The pad oxide 104 may be silicon oxide, $SiO_2$. Silicon nitride 106, $Si_3N_4$, is then deposited on the pad oxide 104. High-density plasma (HDP) oxide 108 is deposited over the entire device 100. Peaks in the HDP oxide 108 correspond to the pad oxide 104 and silicon nitride 106 formations below. In FIG. 1B, the HDP oxide 108 is coated with photoresist 110.

Figure 1C:
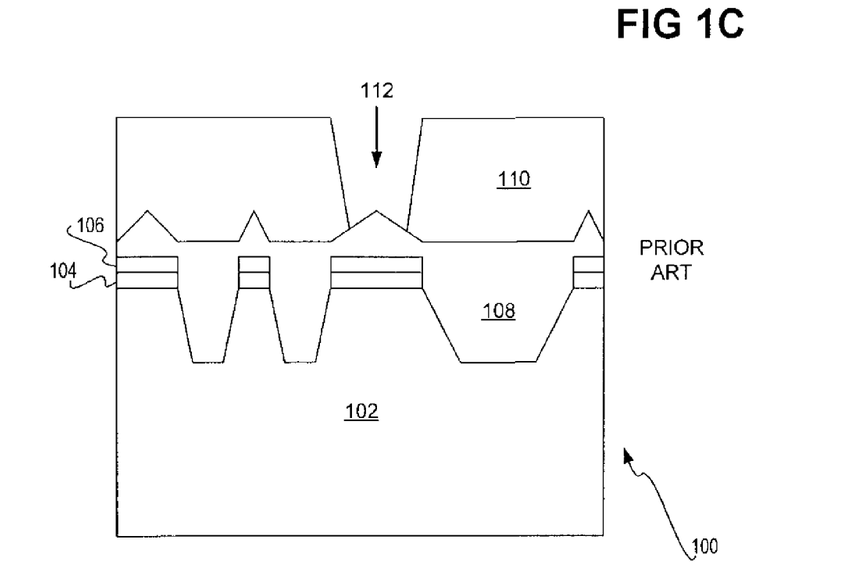
Figure 1D:
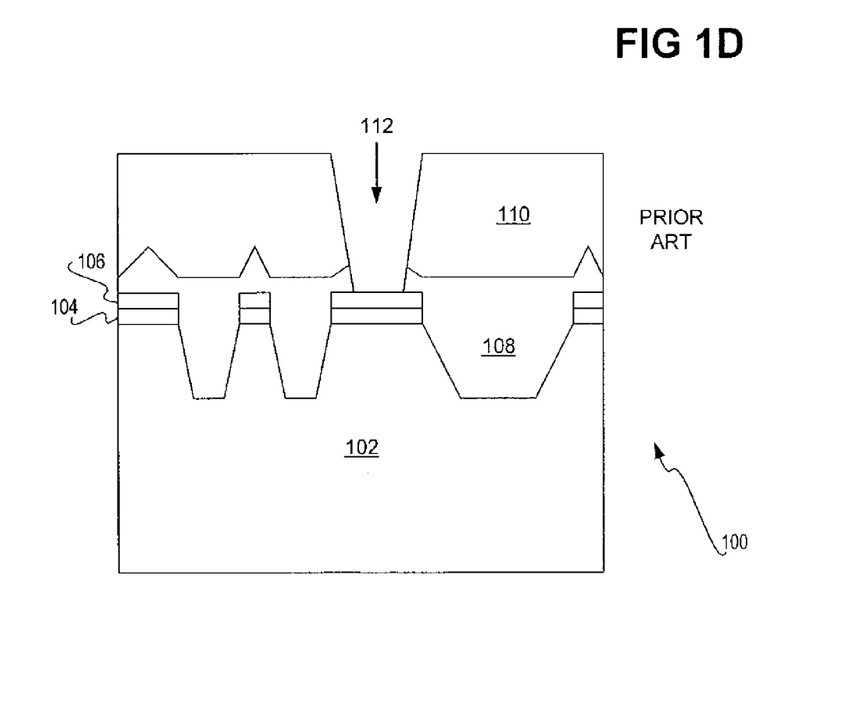
Figure 1E:
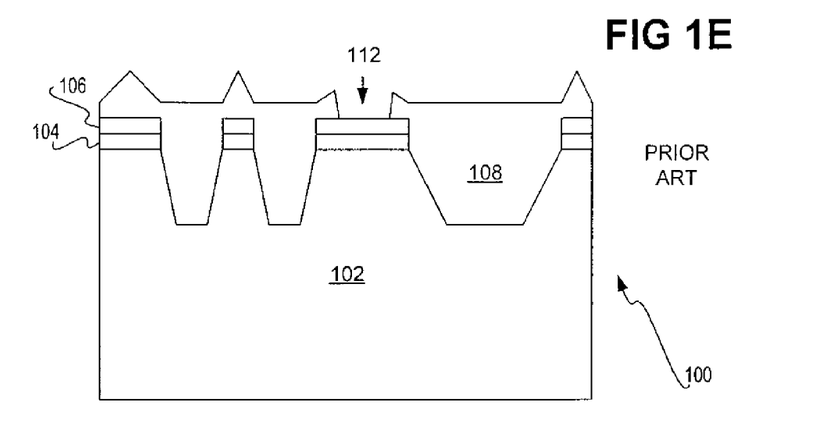
Figure 1F:
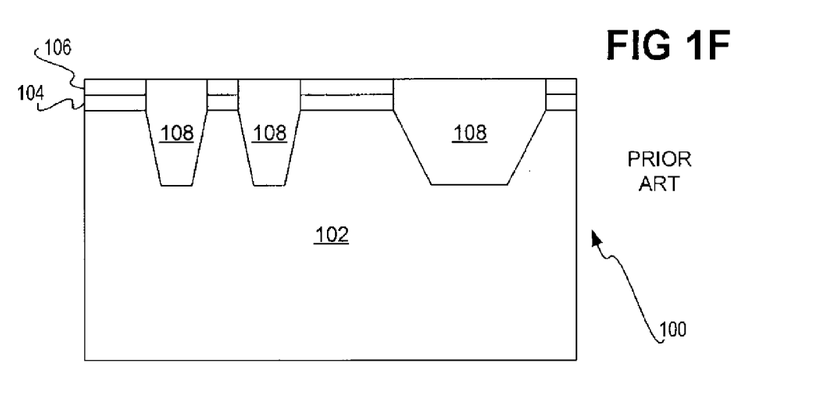
Figure 1G:
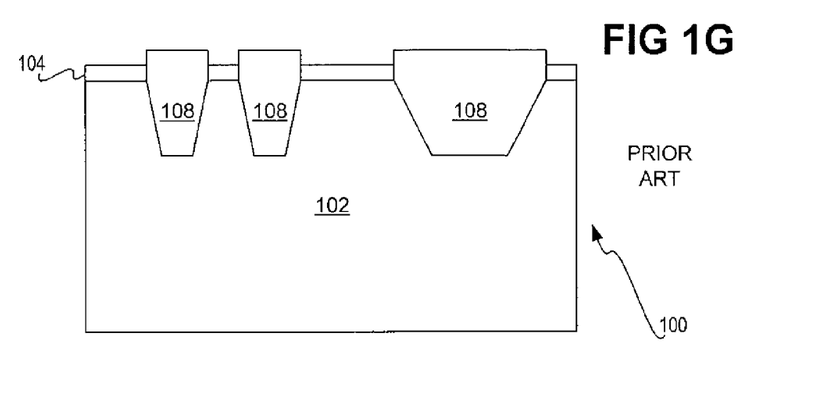

Next, in FIG. 1C, a photolithographic process (exposure plus development) is used with a photomask to define the ODR profile having the trench 112, and then the ODR is etched through to the HDP oxide 108, such that the trench 112 exposes the HDP 108 oxide below. In FIG. 1D, the HDP oxide 108 exposed through the trench 112 is itself etched down to the silicon nitride 106, which acts as a stop layer for the etchant. The photoresist 110 is removed in FIG. 1E. In FIG. 1F, a chemical-mechanical planarization (CMP) process is used to plane the HDP oxide 108 down to the silicon nitride 106. Finally, in FIG. 1G, the silicon nitride 106 is etched away.

The process described in conjunction with FIGS. 1A-1G is problematic, however. First, the mask used in FIG. 1C to define the ODR profile cannot precisely open trenches over all the peaks of the HDP oxide 108. The definition of the ODR profile is substantially accomplished so that there is less of the HDP oxide 108 to be processed by CMP in FIG. 1F. Because more of the HDP oxide 108 remains than desired, this lessens the processing window of the CMP, making the CMP more difficult to accomplish. As a result, CMP may have to be redone a number of times in order to accomplish the desired planarization, and in any case more non-uniformity may result. Furthermore, using a mask to define the ODR is costly, inasmuch as a mask must be fabricated, and so on.

Therefore, there is a need to overcome these disadvantages associated with the prior art. Specifically, there is a need to increase the processing window of the CMP when planarizing the HDP oxide 108. There is a need to accomplish such CMP without having to redo the CMP a number of times. For these and other reasons, therefore, there is a need for the present invention.

SUMMARY OF THE INVENTION

The invention relates to defining an oxide define region (ODR) without using a photomask. A method of the invention includes depositing pad oxide and a stop layer over peaks of a substrate of a semiconductor wafer. The pad oxide may be silicon oxide ($SiO_2$), whereas the stop layer may be silicon nitride ($Si_3N_4$). Oxide, such as high-density plasma (HDP) oxide, is deposited over the pad oxide, the stop layer, and valleys of the substrate of the semiconductor wafer. A hard mask, such as silicon nitride, is deposited over the oxide, and photoresist is deposited over the hard mask. The photoresist is etched back until peaks of the hard mask are exposed. The peaks of the hard mask and the oxide underneath are etched through to the stop layer, and the photoresist is removed. This defines the ODR profile, without use of a photomask. Chemical-mechanical planarization (CMP) can then be performed on the hard mask that remains and the oxide underneath through to the stop layer, and the stop layer removed by etching.

Embodiments of the invention provide for advantages over the prior art. By depositing a hard mask over the oxide, and then etching back deposited photoresist from over the hard mask until the peaks of the hard mask are revealed, the ODR profile is defined without having to use a photomask. The photomask-free technique of the invention has greater resolution than using a photomask, in that more openings in the oxide can be made. The technique is also self-aligning, as compared to the prior art, in which the photomask has to be precisely aligned over the photoresist for proper ODR profiling to occur. Because more openings in the oxide are made using embodiments of the invention, the processing window of the subsequent CMP is increased, too, since there is less oxide to be subjected to the CMP. Thus, less CMP rework is necessary, and uniformity is increased. By not using a photomask, embodiments of the invention are also less costly to perform.

Still other advantages, aspects, and embodiments of the invention will become apparent by reading the detailed description that follows, and by referring to the accompanying drawings.

BRIEF DESCRIPTION OF THE DRAWINGS

FIG. 1C specifically shows defining the ODR using a photomask. Definition of the ODR using the photomask results in a smaller CMP processing window when CMP is performed in FIG. 1F.

FIG. 2C specifically shows how this embodiment of the invention defines the ODR without using a photomask. Definition of the ODR without using a photomask results in a larger CMP processing window when CMP is performed in FIG. 2F.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 2A:
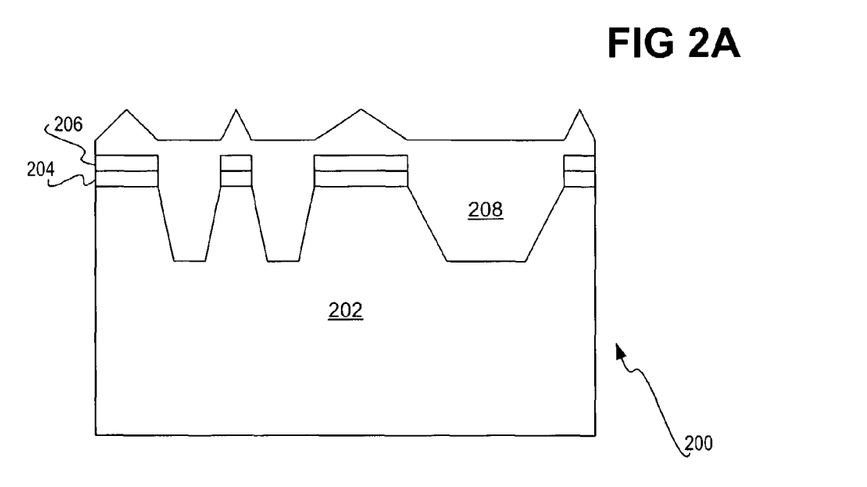
FIGS. 2A-2G are diagrams illustratively showing a process that includes defining an ODR without using a photomask, according to an embodiment of the invention.

FIGS. 2A-2G illustratively show the manner by which one embodiment of the invention defines oxide define regions (ODR's). The ODR's may be part of and/or used in conjunction with the fabrication of a semiconductor device, such as a static random-access memory (SRAM). In FIG. 2A, the semiconductor device 200 being fabricated includes a substrate 202. The substrate 202 is fabricated on a semiconductor wafer, and may be a p substrate. Pad oxide 204 has been grown or deposited on the peaks of the substrate 202, where the substrate 202 also includes valleys. The peaks of the substrate 202 are the highest points of the substrate 202, whereas the valleys of the substrate 202 are the lowest points of the substrate 202. The pad oxide 204 may be silicon oxide, $SiO_2$. A stop layer 206 is then deposited on the pad oxide 204. The stop layer 206 may be silicon nitride, $Si_3N_4$, or another type of stop layer. Finally, oxide 208 is deposited over the entire device 200. Peaks in the oxide 208 correspond to the pad oxide 204 and the stop layer 206 formations below. The oxide 208 may be high-density plasma (HDP) oxide.

Figure 2B:
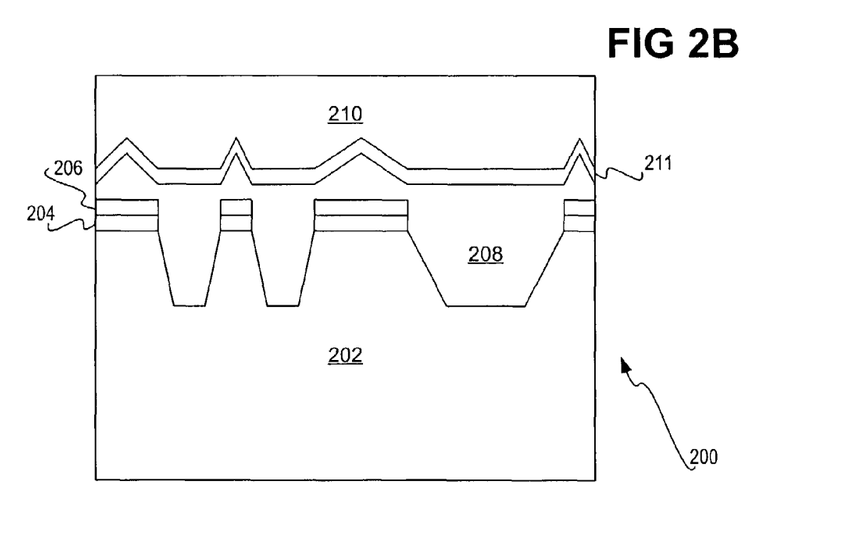
Figure 2C:
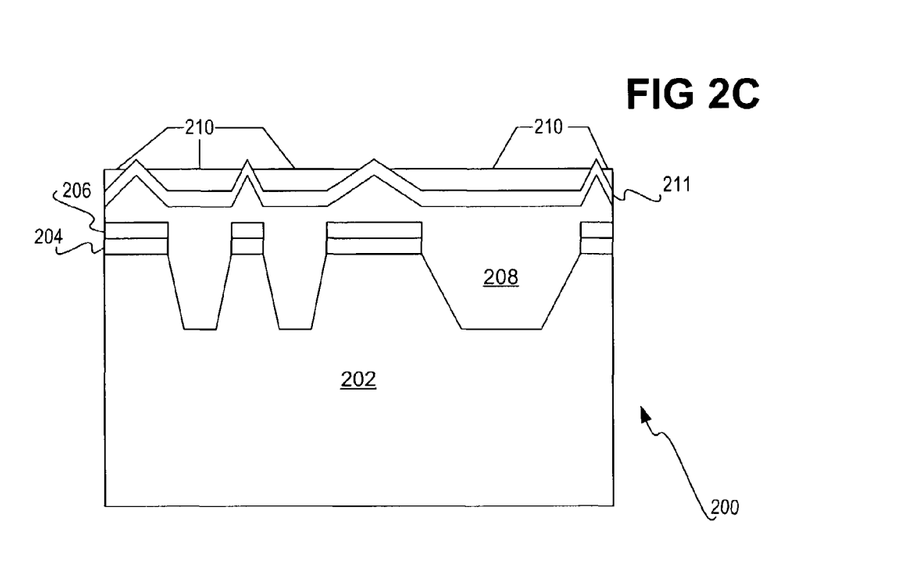

In FIG. 2B, a thin hard mask layer 211 is deposited over the oxide 208, such that peaks and valleys of the hard mask layer 211 correspond to corresponding peaks and valleys of the oxide 208. The hard mask layer 211 may be silicon nitride. The thickness of the hard mask layer 211 may be 100-200 angstroms. Coated or deposited over the hard mask layer 211 is photoresist 210. In FIG. 2C, the photoresist 210 is etched back to the hard mask layer 211, such that the peaks of the hard mask layer 211 are revealed or exposed. This defines the ODR profile, without employing a photomask. Furthermore, the resolution of the ODR profile defined in accordance with embodiments of the invention preferably has greater resolution than that defined in accordance with the prior art using a photomask. That is, the smaller, less-wide peaks are exposed preferably in accordance with embodiments of the invention, and not just the larger, more-wide peak as in the prior art.

Figure 2D:
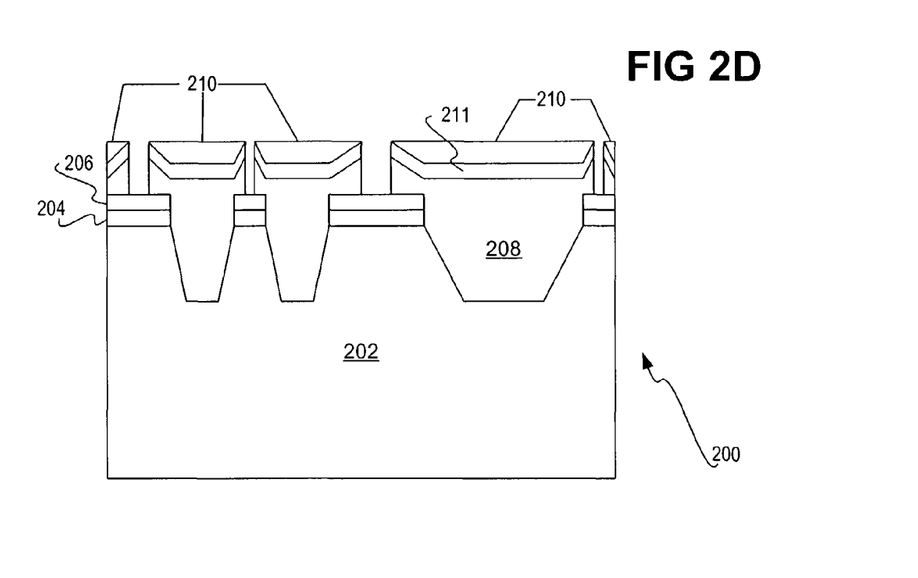

In FIG. 2D, the exposed hard mask layer 211, that is, the peaks of the hard mask layer 211 exposed in FIG. 2C, are opened, and the oxide 208 underneath the peaks of the hard mask layer 211 are etched down to the stop layer 206. Thus, there are trenches through the oxide 208 that correspond to the previously exposed peaks of the hard mask layer 211 in FIG. 2C. Preferably, the etching is accomplished with a high-selectivity etchant that is selective only to the oxide 208. Furthermore, the hard mask layer 211 that is exposed may be opened via this etching. It is noted that in comparison to the prior art, embodiments of the invention remove more of the oxide 208, because the ODR profile has a better resolution in embodiments of the invention than in the prior art. That is, more trenches within the oxide 208 are etched using embodiments of the invention, including smaller trenches, and not just the large trench as removed in the prior art.

Figure 2E:
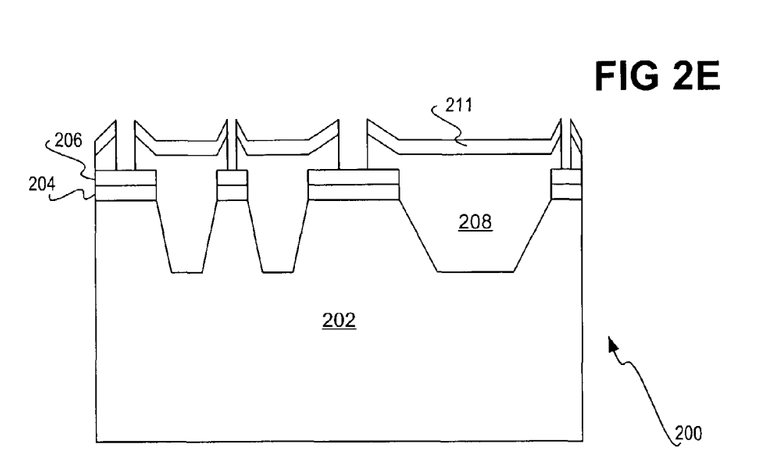
Figure 2F:
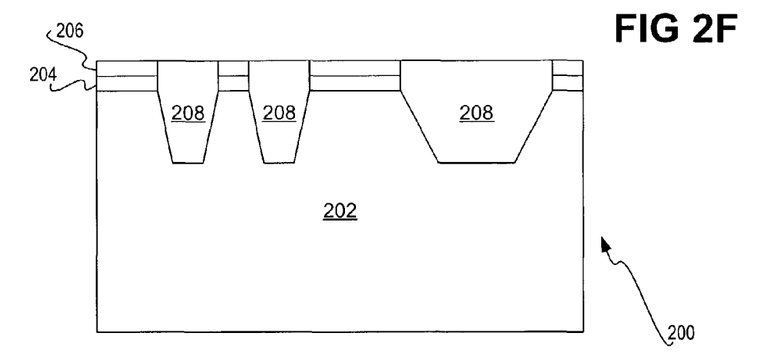

In FIG. 2E, the remaining photoresist 210 is removed. In FIG. 2F, a chemical-mechanical planarization (CMP) process is used to remove the remaining hard mask layer 211 and plane the oxide 208 down to the stop layer 206. The processing window of the CMP process in FIG. 2F is greater than that in the prior art. This is because less of the oxide 208 has to be removed, since more of the oxide 208 was removed during etching of the oxide 208 in FIG. 2D, as compared to FIG. 1D in the prior art. That is, CMP is more easily performed since less of the oxide 208 remains to be planed. As a result, less CMP rework is likely to be needed, if any, in accordance with embodiments of the invention. Finally, in FIG. 2G, the stop layer 206 is etched away.

Figure 2G:
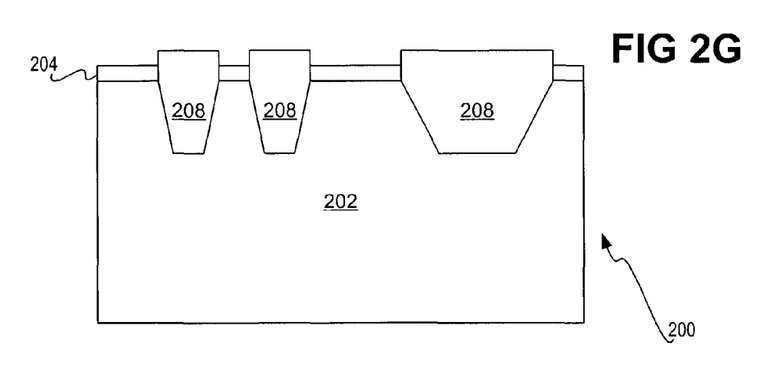
Figure 3:
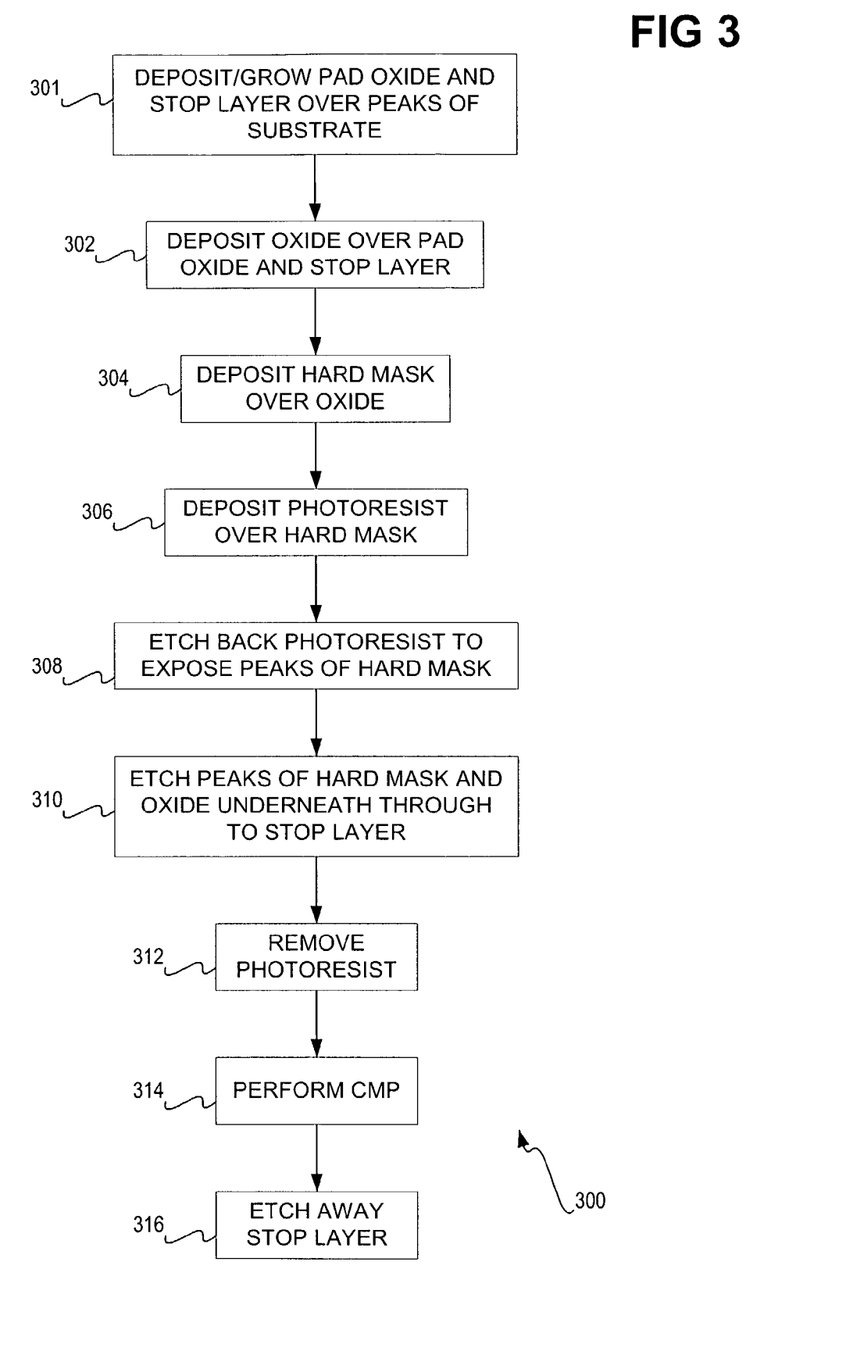
FIG. 3 is a flowchart of a method that includes defining an ODR without using a photomask, according to an embodiment of the invention. The method of FIG. 3 is consistent with the process illustratively depicted in the diagrams of FIGS. 2A-2G.

FIG. 3 shows a method 300 according to an embodiment of the invention. The method 300 is consistent with the process described in conjunction with FIGS. 2A-2G. Furthermore, a semiconductor device according to an embodiment of the invention, such as an SRAM, may be at least partially fabricated by performing the method 300. First, pad oxide and a stop layer are deposited over the peaks of a substrate of a semiconductor wafer (301). The pad oxide may be deposited by being grown. The stop layer may be silicon nitride. Next, oxide, such as HDP oxide, is deposited over the pad oxide and the stop layer (302). Thus, the HDP oxide has peaks and valleys corresponding to the peaks and valleys of the substrate. The performance of 301 and 302 are illustrated in FIG. 2A. A hard mask layer is then deposited over the oxide (304). The hard mask layer may be silicon nitride. The hard mask layer is preferably thin. Furthermore, the hard mask layer has peaks and valleys corresponding to the peaks and valleys of the oxide.

Next, photoresist is deposited over the hard mask layer (306). The performance of 304 and 306 are illustrated in FIG. 2B. The photoresist is then etched back to expose the peaks of the hard mask layer (308), which is illustrated in FIG. 2C. Next, the peaks of the hard mask and the oxide underneath these peaks are etched through to the stop layer (310). More specifically, the etching of the peaks of the hard mask may include first opening these exposed peaks of the hard mask prior to etching the oxide underneath the hard mask peaks. The performance of 310 is illustrated in FIG. 2D. The photoresist that remains is then removed (312), which is illustrated in FIG. 2E. CMP is performed on the hard mask and the oxide underneath the hard mask through to the stop layer (314), which is illustrated in FIG. 2F. Finally, the stop layer is removed (316), such as by etching it away, which is illustrated in FIG. 2G.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A method for fabricating an oxide define region (ODR) without using a photolithographic-process photomask comprising:
    depositing pad oxide and a stop layer over peaks of a substrate of a semiconductor wafer;
    depositing oxide over the pad oxide, the stop layer, and valleys of the substrate of the semiconductor wafer;
    depositing a hard mask over oxide;
    depositing photoresist over the hard mask;
    etching back the photoresist until peaks of the hard mask are exposed;
    etching the peaks of the hard mask and the oxide underneath the hard mask through to the stop layer;
    removing the photoresist;
    performing chemical-mechanical planarization (CMP) on the hard mask and the oxide underneath through to the stop layer; and,
    etching away the stop layer, resulting in the ODR on the substrate of the semiconductor wafer.

2. The method of claim 1, wherein the pad oxide comprises silicon oxide (SiO2).

3. The method of claim 1, wherein the stop layer comprises silicon nitride (Si3N4).

4. The method of claim 1, wherein the oxide comprises high-density plasma (HDP) oxide.

5. The method of claim 1, wherein the hard mask comprises silicon nitride (Si3N4).

6. A method for fabricating an oxide define region (OUR) without using a photolithographic-process photomask comprising:
depositing high-density plasma (HDP) oxide over a substrate having peaks and valleys, the peaks having pad oxide and a first silicon nitride layer thereover, the HDP oxide having peaks and valleys corresponding to the peaks and valleys of the substrate;
depositing a second silicon nitride layer over the HDP, oxide, the second silicon nitride layer having peaks and valleys corresponding to the peaks and valleys of the HDP oxide;
depositing photoresist over the second silicon nitride layer;
etching back the photoresist until the peaks of the second silicon nitride layer are exposed; and,
etching the peaks of the second silicon nitride layer and the HDP oxide underneath through to the first silicon nitride layer, resulting in the OAR on the substrate.

7. The method of claim 6, further comprising removing the photoresist.

8. The method of claim 7, further comprising performing chemical-mechanical planarization (CMP) on the second silicon nitride layer and the HDP oxide through to the first silicon nitride layer.

9. The method of claim 8, further comprising etching away the first silicon nitride layer.

10. The method of claim 6, further initially comprising depositing the pad oxide and the stop layer over the peaks of the substrate.

11. The method of claim 6, the pad oxide comprises silicon oxide (SiO2).

* * * * *